(12) United States Patent
Zan et al.

(10) Patent No.: US 9,236,494 B2
(45) Date of Patent: Jan. 12, 2016

(54) FIELD EFFECT TRANSISTOR

(71) Applicant: E Ink Holdings Inc., Hsinchu (TW)

(72) Inventors: Hsiao-Wen Zan, Hsinchu (TW); Chun-Hung Liao, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/710,427

(22) Filed: Dec. 10, 2012

(65) Prior Publication Data

US 2013/0146868 A1  Jun. 13, 2013

Related U.S. Application Data

(60) Provisional application No. 61/569,789, filed on Dec. 13, 2011.

(30) Foreign Application Priority Data

Nov. 7, 2012  (TW) ............................... 101141319 A

(51) Int. Cl.
| | | |
|---|---|---|
| *H01L 29/10* | (2006.01) | |
| *H01L 29/786* | (2006.01) | |
| *H01L 29/267* | (2006.01) | |

(52) U.S. Cl.
CPC ........ *H01L 29/78693* (2013.01); *H01L 29/267* (2013.01); *H01L 29/78696* (2013.01)

(58) Field of Classification Search
CPC ............ H01L 27/1214; H01L 27/1251; H01L 27/3244–27/3297; H01L 29/4908; H01L 51/0508–51/0533; H01L 2924/13069; H01L 29/41733; H01L 29/42384; H01L 29/66265; H01L 29/66742–29/6675; H01L 29/7317; H01L 29/786
See application file for complete search history.

(56) References Cited

U.S. PATENT DOCUMENTS

| | | | |
|---|---|---|---|
| 7,579,653 B2 | 8/2009 | Suh et al. | |
| 7,635,877 B2 | 12/2009 | Waki et al. | |
| 7,928,427 B1 | 4/2011 | Chang | |
| 2008/0038882 A1* | 2/2008 | Takechi et al. | ................ 438/151 |
| 2009/0127622 A1 | 5/2009 | Song | |
| 2009/0236596 A1 | 9/2009 | Itai | |
| 2009/0321731 A1 | 12/2009 | Jeong et al. | |
| 2010/0038641 A1* | 2/2010 | Imai | ................ 257/57 |

(Continued)

FOREIGN PATENT DOCUMENTS

| | | |
|---|---|---|
| CN | 101673770 A | 3/2010 |
| CN | 101740564 A | 6/2010 |

(Continued)

OTHER PUBLICATIONS

Eun Lyoung Kim, Sang Kooun Jung, Choong Soo Kim, and Duck Kyu Park, "Room Temperature Deposition of Indium Zinc Oxide Films on PES Substrate by LF Magnetron Sputtering", Journal of the Korean Physical Society, vol. 51, No. 2 Aug. 2007, pp. 589-593.*

(Continued)

*Primary Examiner* — David Vu
*Assistant Examiner* — Cuong Nguyen
(74) *Attorney, Agent, or Firm* — CKC & Partners Co., Ltd.

(57) ABSTRACT

A field effect transistor (FET) is provided. The active layer of this FET is composed of at least two different amorphous metal oxide semiconductor layer stacked together. Therefore, the two opposite surfaces of the active layer can have different band gap values.

9 Claims, 2 Drawing Sheets

(56) References Cited

U.S. PATENT DOCUMENTS

| | | | |
|---|---|---|---|
| 2010/0051923 A1 | 3/2010 | Denker et al. | |
| 2010/0059742 A1 | 3/2010 | Shieh | |
| 2010/0102324 A1 | 4/2010 | Toguchi et al. | |
| 2010/0133530 A1* | 6/2010 | Akimoto et al. | 257/43 |
| 2011/0097842 A1 | 4/2011 | Yang et al. | |
| 2011/0147735 A1 | 6/2011 | Cheong | |
| 2011/0220887 A1 | 9/2011 | Wang et al. | |
| 2011/0254061 A1 | 10/2011 | Yan et al. | |
| 2012/0085999 A1* | 4/2012 | Song et al. | 257/43 |

FOREIGN PATENT DOCUMENTS

| | | | |
|---|---|---|---|
| JP | 2000124456 A | 4/2000 | |
| WO | 2010093051 A1 | 8/2010 | |

OTHER PUBLICATIONS

Sudheer Kumar, B. Srinivas Goud, R. Singh, "Growth and Characterization of Nickel Catalyzed Gallium Oxide Nanowires on Sapphire Substrate", Journal of Nano- and Electronic Physics, vol. 5, No. 2, 02003 (2013).*

Wei-Tsung Chen, Hsiu-Wen Hsueh, Hsiao-Wen Zan, and Chuang-Chuang Tsai, "Light-Enhanced Bias Stress Effect on Amorphous In—Ga—Zn—O Thin-film Transistor with Lights of Varying Colors", Electrochemical and Solid-State Letters, 14 (7), May 3, 2011, pp. H297-H299.*

High electron mobility Zn polar ZnMgO/ZnO heterostructures grown by molecular beam epitaxy (H. Tampo, K. Matsubara, A. Yamada, H. Shibata, P. Fons, M. Yamagata, H. Kanie, S. Niki / Journal of Crystal Growth, vols. 301-302, Apr. 2007, pp. 358-361 / Mar. 6, 2007).

Two dimensional electron gases in polycrystalline MgZnO/ZnO heterostructures grown by rf-sputtering process (Huai-An Chin, I-Chun Cheng, Chih-I Huang, Yuh-Renn Wu, Wen-Sen Lu et al. / J. Appl. Phys. 108, 054503 (2010) / Sep. 7, 2010).

Achieving High Field-Effect Mobility in Amorphous Indium—Gallium—Zinc Oxide by Capping a Strong Reduction Layer (Hsiao-Wen Zan, Chun-Cheng Yeh, Hsin-Fei Meng, Chuang-Chuang Tsai, Liang-Hao Chen / Advanced Materials, vol. 24, Issue 26, pp. 3509-3514, Jul. 10, 2012 / Jun. 8, 2012).

The office action of the corresponding Taiwanese application.

Corresponding CN Office Action that these art references were cited.

Corresponding Chinese Office Action that these art references were cited on May 18, 2015.

* cited by examiner

FIELD EFFECT TRANSISTOR

CROSS-REFERENCE TO RELATED APPLICATION

This application claims the priority benefit of provisional application Ser. No. 61/569,789, filed Dec. 13, 2011, the full disclosure of which is incorporated herein by reference. This application also claims the priority benefit of Taiwan application serial no. 101141319, filed Nov. 7, 2012, the full disclosure of which is incorporated herein by reference.

BACKGROUND

1. Technical Field

The disclosure relates to a semiconductor device. More particularly, the disclosure relates to a metal oxide semiconductor transistor.

2. Description of Related Art

Metal oxide semiconductor transistor is a transistor using metal oxide semiconductor layer to be its active layer. Comparing with those transistors using amorphous silicon layer as their active layers, the metal oxide semiconductor transistors have higher charge carrier mobility. While comparing with those transistors using low-temperature polysilicon layer as their active layers, the metal oxide semiconductor transistors have simpler manufacturing process and more uniform metal oxide semiconductor layers to make the metal oxide semiconductor transistors have better performance.

At the present time, increasing the mobility of the charge carriers is a method to further improve the performance of the transistors. One of the common ways is to crystallize the transistor's active layer to form a polycrystalline structure. For example, the transistors using polysilicon layer to be the active layer can have higher charge carriers mobility. However, the formation of the polysilicon increases the difficulty of the manufacturing process, and the non-uniformity of the polysilicon layer decreases the performance of the transistor. Besides, changing the material of the active layer is another way to increase the mobility of the transistors' charge carrier, but the R&D difficulty for finding new replaceable materials is also increased. Therefore, it is unfavorable to increase the improving rate of the transistors' performance.

SUMMARY

In one aspect, the present invention is directed to a field effect transistor (FET) having improved charge carriers mobility.

The FET includes a gate, a gate insulating layer, an active layer, a source, and a drain. The gate, the gate insulating layer and the active layer are sequentially stacked on a substrate. The active layer has a first surface and a second surface opposite to the first surface. A first band gap value at the first surface and a second band gap value at the second surface are different. The source and the drain respectively connect to the active layer.

According to an embodiment, the difference between the first band gap value and the second band gap value are at least 0.5 eV.

According to another embodiment, the FET further includes a third metal oxide semiconductor layer located between the two different metal oxide semiconductor layers. A third band gap value of the third metal oxide semiconductor layer also between the first band gap value and the second band gap value.

According to yet another embodiment, the gate, the source and the drain are located on the same side of the active layer.

According to yet another embodiment, the gate is located on one side of the active layer, and the source and the drain are located on the opposite side of the active layer.

The foregoing presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later. Many of the attendant features will be more readily appreciated as the same becomes better understood by reference to the following detailed description considered in connection with the accompanying drawings.

DETAILED DESCRIPTION

Figure 1:
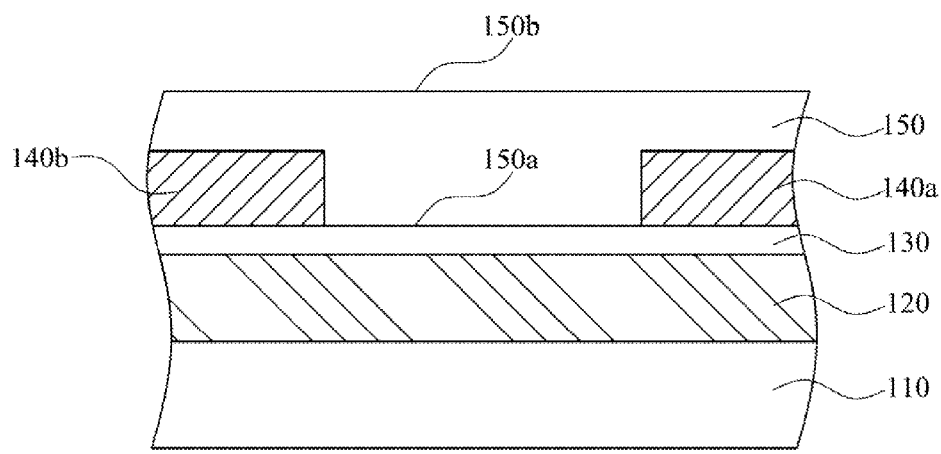
FIG. 1 is a cross-sectional diagram of a field effect transistor according to an embodiment of this invention.

Accordingly, a field effect transistor (FET) having improved electron mobility is provided. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The FET includes a gate, a gate insulating layer, an active layer, a source, and a drain. According to an embodiment, the gate, the gate insulating layer and the active layer are sequentially stacked on a substrate. The source and the drain respectively connect to the active layer.

According to another embodiment, the gate, the source and the drain are located on the same side of the active layer. According to yet another embodiment, the gate is located on one side of the active layer, and the source and the drain are located on the opposite side of the active layer. The material of the gate, the source and the drain can be doped semiconductor material, metal silicide, or metal, for example. The material of the gate insulating layer can be silicon oxide, silicon nitride, silicon oxynitride, or other dielectric materials having high dielectric constant, for example.

The active layer has a first surface and a second surface opposite to the first surface. A first band gap value at the first surface and a second band gap value at the second surface are different. Therefore, the active layer has at least two different amorphous metal oxide semiconductor layers stacked together to make the first band gap value at the first surface and a second band gap value at the second surface different.

According to an embodiment, the difference between the first band gap value and the second band gap value are at least 0.5 eV, such as at least 1 eV, to effectively increase the electron mobility in the active layer. The metal oxide semiconductor materials combined for the active layer can be selected from the following metal oxide semiconductor materials, such as indium gallium zinc oxide (IGZO)、indium gallium oxide (IGO)、indium zinc oxide (IZO)、zinc oxide (ZnO)、calcium oxide (CaO)、magnesium oxide (MgO)、aluminum oxide ($Al_2O_3$), indium xoide ($In_2O_5$), gallium oxide ($GaO_2$), titanium oxide ($TiO_2$), zirconium oxide ($ZrO_2$), and other suitable metal oxide semiconductor materials. At least two different metal oxide semiconductor materials are stacked to form the active layer above to make the first surface and the second surface have different band gap values.

After stacking two different metal oxide semiconductor layers, a heterojunction structure is usually formed to accumulate high density electrons, and thus effectively increase electron mobility. This phenomenon is very common in III-V semiconductor material with single crystal structure, and is used by high electron mobility transistor (HEMT) to greatly increase the electron mobility thereof. In polycrystalline system, Huai-An Chin (Journal of Applied Physics 108, 054503 (2010)) observed a similar phenomenon occurred in MgZnO/ZnO system. However, in amorphous system, no one ever predict or observe the similar phenomenon. The reason may be that electrons can easily move within one single crystal, but jump over the interface between different crystal grains is a very difficult thing. Therefore, the crystallinity of a material is poorer, the electron mobility is poorer.

Accordingly, the active layer of the FET are composed by at least two different amorphous metal oxide semiconductor layers, the electron mobility still can be increased. This is an unexpected result for persons skilled in the art. Some embodiments are described below to detail illustrate the FET structure.

Embodiment 1

FIG. 1 is a cross-sectional diagram of a field effect transistor according to an embodiment of this invention. In FIG. 1, the field effect transistor 100 includes a gate 120, a gate insulating layer 130, a source 140a, a drain 140b and an active layer 150. The active layer 150 has a first surface 150a and a second surface 150b opposite to the first surface 150a. The gate 120, the gate insulating layer 130, and the active layer 150 are sequentially stacked on the substrate 110. The source 140a and the drain 140b are located between the gate insulating layer 130 and the active layer 150 and separated by a distance. That is, the gate 120, the source 140a and the drain 140b are all disposed below the active layer 150.

According to an embodiment, the active layer 150 has at least two different metal oxide semiconductor layers stacked together (not shown in FIG. 1A) and positioned respectively at the sides of the first surface 150a and the second surface 150b. According to another embodiment, the above two different metal oxide semiconductor layers can be gradually mixed together, so that the first band gap value at the side of the first surface 150a can gradually change to the second band gap value at the side of the second surface 150b. According to yet another embodiment, at least a third metal oxide semiconductor layer can be sandwiched between the above at least two different metal oxide semiconductor layers. The third band gap value of the third metal oxide semiconductor layer is between the first band gap value at the first surface 150a and the second band gap value at the second surface 150b of the active layer 150.

For example, an amorphous indium gallium zinc oxide (a-IGZO) layer was located at the first surface 150a of the active layer 150. A calcium metal layer was then stacked on the a-IGZO layer. The calcium diffused into the a-IGZO layer and then oxidized by the a-IGZO layer to form an amorphous indium gallium zinc calcium oxide (a-IGZCaO) layer at the second surface 150b. Therefore, a heterojunction structure of a-IGZO/a-IGZCaO was formed. The result above was affirmed by X-ray photoelectron spectroscopy (XPS). The electron mobility of a-IGZO was 12 $cm^2V^{-1}s^{-1}$, and the electron mobility of a-IGZO/a-IGZCaO was increased to 160 $cm^2V^{-1}s^{-1}$. This surprising result is completely unexpected.

Embodiment 2

Figure 2:
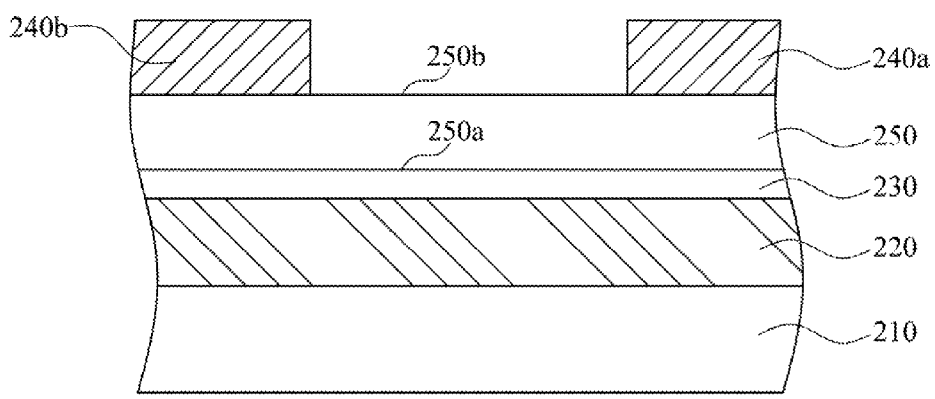
FIG. 2 is a cross-sectional diagram of a field effect transistor according to another embodiment of this invention.

FIG. 2 is a cross-sectional diagram of a field effect transistor according to another embodiment of this invention. In FIG. 2, the field effect transistor 200 includes a gate 220, a gate insulating layer 230, a source 240a, a drain 240b and an active layer 250. The active layer 250 has a first surface 250a and a second surface 250b opposite to the first surface 250a. The gate 220, the gate insulating layer 230, and the active layer 250 are sequentially stacked on the substrate 210. The source 240a and the drain 240b are located on the active layer 250 and separated by a distance. That is, the gate 220 is disposed below the active layer 150, and the source 140a and the drain 140b are located on the active layer 250. Since the details of the active layer 250 is the same as the active layer 150 in FIG. 1 above, and hence omitted here.

Embodiment 3

Figure 3:
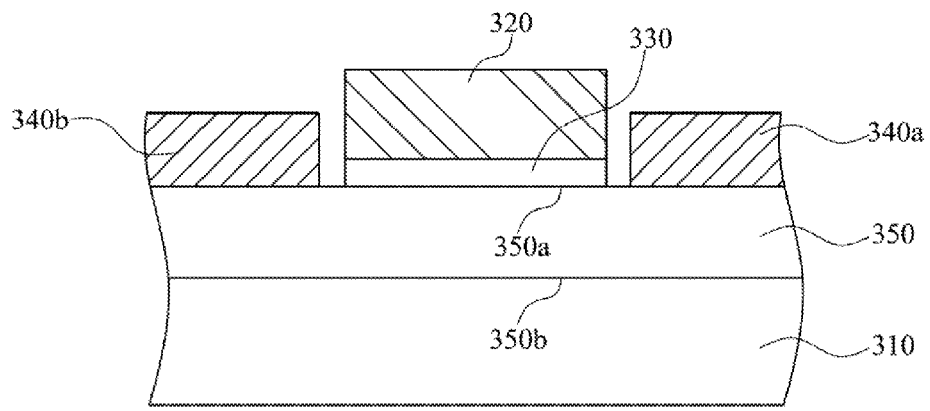
FIG. 3 is a cross-sectional diagram of a field effect transistor according to yet another embodiment of this invention.

FIG. 3 is a cross-sectional diagram of a field effect transistor according to yet another embodiment of this invention. In FIG. 3, the field effect transistor 300 includes a gate 320, a gate insulating layer 330, a source 340a, a drain 340b and an active layer 350. The active layer 350 has a first surface 350a and a second surface 350b opposite to the first surface 350a. The active layer 350, the gate insulating layer 330, and the gate 320 are sequentially stacked on the substrate 310. The source 340a and the drain 340b are located on the active layer 350 and separated by a distance. That is, the gate 320, the source 340a, and the drain 340b are all disposed on the active layer 350. Since the details of the active layer 350 is the same as the active layer 150 in FIG. 1 above, and hence omitted here.

Embodiment 4

Figure 4:
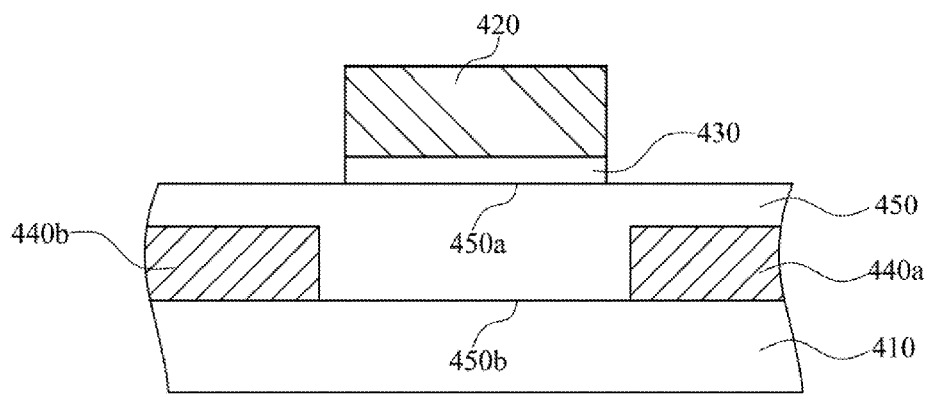
FIG. 4 is a cross-sectional diagram of field effect transistor according to yet another embodiment of this invention.

FIG. 4 is a cross-sectional diagram of a field effect transistor according to yet another embodiment of this invention. In FIG. 4, the field effect transistor 400 includes a gate 420, a gate insulating layer 430, a source 440a, a drain 440b and an active layer 450. The active layer 450 has a first surface 450a and a second surface 450b opposite to the first surface 450a. The active layer 450, the gate insulating layer 430, and the gate 420 are sequentially stacked on the substrate 410. The source 440a and the drain 440b are located between the active layer 450 and the substrate 410, and separated by a distance. That is, the gate 420 is located on the active layer, and the source 440a and the drain 440b are disposed below the active layer 450. Since the details of the active layer 450 is the same as the active layer 150 in FIG. 1 above, and hence omitted here.

According to the embodiments above, it can be known that if the active layer of a FET comprises at least two amorphous metal oxide semiconductor layers stacked together, a heterojunction structure can be also formed to greatly increase the electron mobility of the active layer, and the performance of the FET is thus greatly improved.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A field effect transistor, comprising;
   a gate;
   a gate insulating layer;
   an active layer having a first surface and a second surface opposite to the first surface, wherein the gate, the gate insulating layer and the active layer are sequentially stacked on a substrate, the active layer has a first metal oxide semiconductor layer and a second metal oxide semiconductor layer different from each other, the first metal oxide semiconductor layer is physically in contact with the second metal oxide semiconductor layer, and the first and second metal oxide semiconductor layers constitute a heterojunction of indium gallium zinc oxide and indium gallium zinc calcium oxide; and a source arid a drain respectively connecting to the active layer.

2. The field effect transistor of claim 1, wherein the first and second surfaces respectively have a first band gap value and a second band gab value, and a difference between the first band gap value and the second band gap value is at least 0.5 eV.

3. The field effect transistor of claim 2, wherein the difference between the first band gap value and the second band gap value is at least 1 eV.

4. The field effect transistor of claim 2, wherein the first band gap value at the first surface is gradually changed to the second band gap value at the second surface of the active layer.

5. The field effect transistor of claim 1, wherein the gate, the source and the drain are located on the same side of the active layer.

6. The field effect transistor of claim 1. wherein the gate is located on one side of the active layer, and the source and the drain are located on the opposite side of the active laver.

7. The field effect transistor of claim 1, wherein the first and second metal oxide semiconductor layers are amorphous.

8. The field effect transistor of claim 1, wherein the gate directly contacts the substrate.

9. The field effect transistor of claim 1, wherein the source and the drain directly contact the gate insulating layer.

* * * * *